United States Patent [19]

Williams

[11] Patent Number: 5,343,177

[45] Date of Patent: Aug. 30, 1994

[54] SIMULATED COUPLED INDUCTORS USING GENERALIZED IMPEDANCE CONVERTERS

[75] Inventor: Austin M. Williams, Diamond Bar, Calif.

[73] Assignee: Hughes Aircraft Company, Los Angeles, Calif.

[21] Appl. No.: 983,937

[22] Filed: Dec. 1, 1992

[51] Int. Cl.$^5$ .................................. H03H 11/04
[52] U.S. Cl. ...................................... 333/213; 333/214
[58] Field of Search ................................. 333/213–215

[56] References Cited

U.S. PATENT DOCUMENTS 5,093,642  3/1992  Mittel ............................. 333/215

FOREIGN PATENT DOCUMENTS 1555822  4/1990  U.S.S.R. ............................. 333/214

OTHER PUBLICATIONS

Soderstrand, *Active R Ladders: High-Frequency High Order Low-Sensitivity Active R Filters Without External Capacitors*, IEEE Trans. on C&S, Dec. 1978, pp. 1032–1038.

Suzuki, *Technique for Simplifying GIC Networks and Its Application to Capacitance-Multipliable LC Simulation Active Filters*, Proc. of IEEE, Jun. 1980, pp. 741–743.

*Primary Examiner*—Paul Gensler
*Attorney, Agent, or Firm*—W. K. Denson-Low

[57] ABSTRACT

Apparatus and methods are disclosed for use in electronic circuits that contain Generalized Impedance Converters and shape frequency response. The combined effect of two Generalized Impedance Converters 30 and 34 with their outputs connected to a coupler 32 simulates coupled capacitors FIG. 2(B) or coupled inductors FIG. 2(A) through impedance scaling. The resistors used in the coupler 32 define the degree of coupling between the first and second Generalized Impedance Converter 30 and 34 respectively. In one embodiment, simulated coupled inductors 96, 98 and 100 are used in a bandpass circuit along with additional R-C devices to control upper and lower sideband attenuation and resonant frequency. Here, the resistors in the coupler device 86 simulate the mutual inductance 98 of coupled inductors.

6 Claims, 4 Drawing Sheets

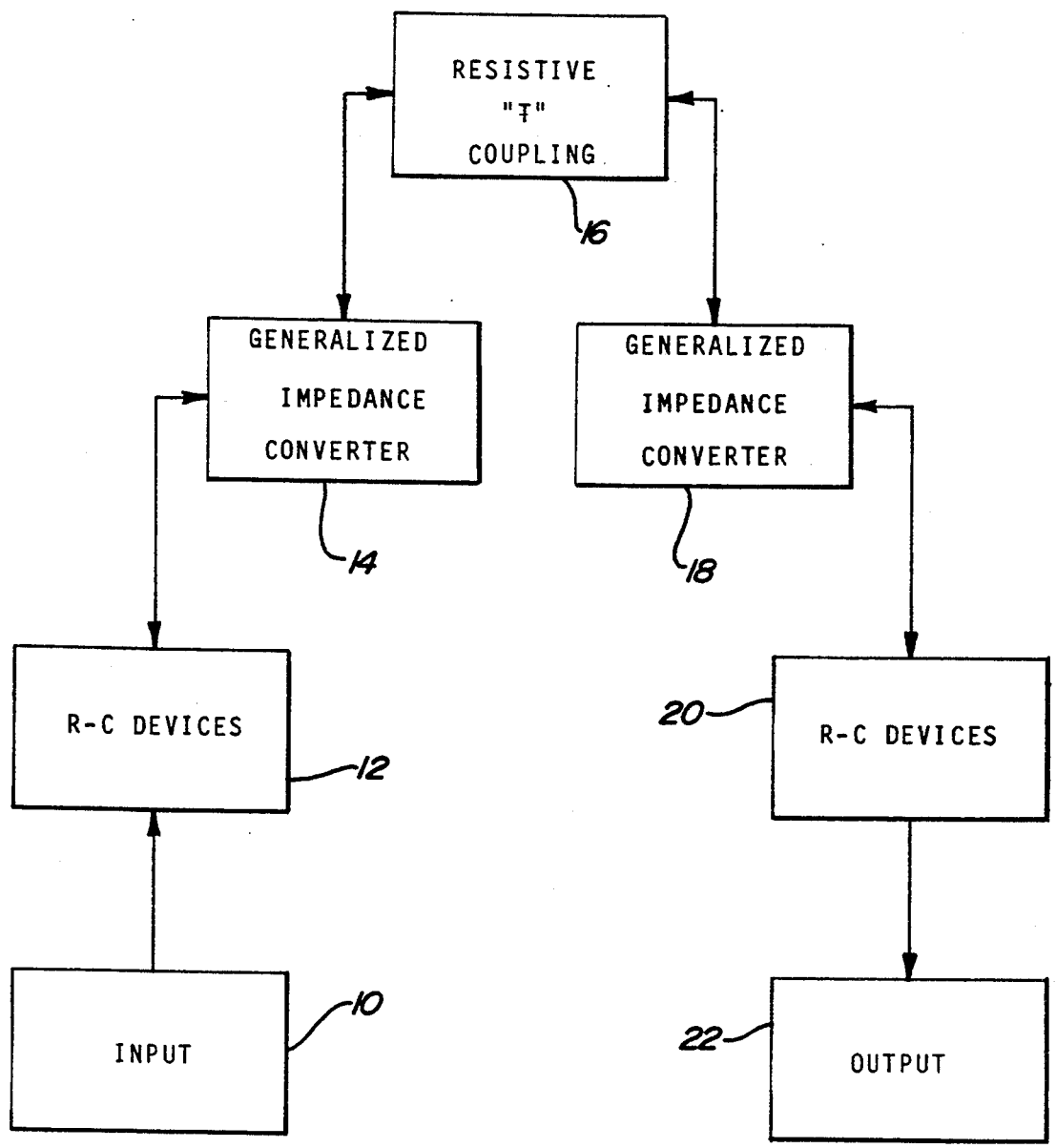
IFig-1

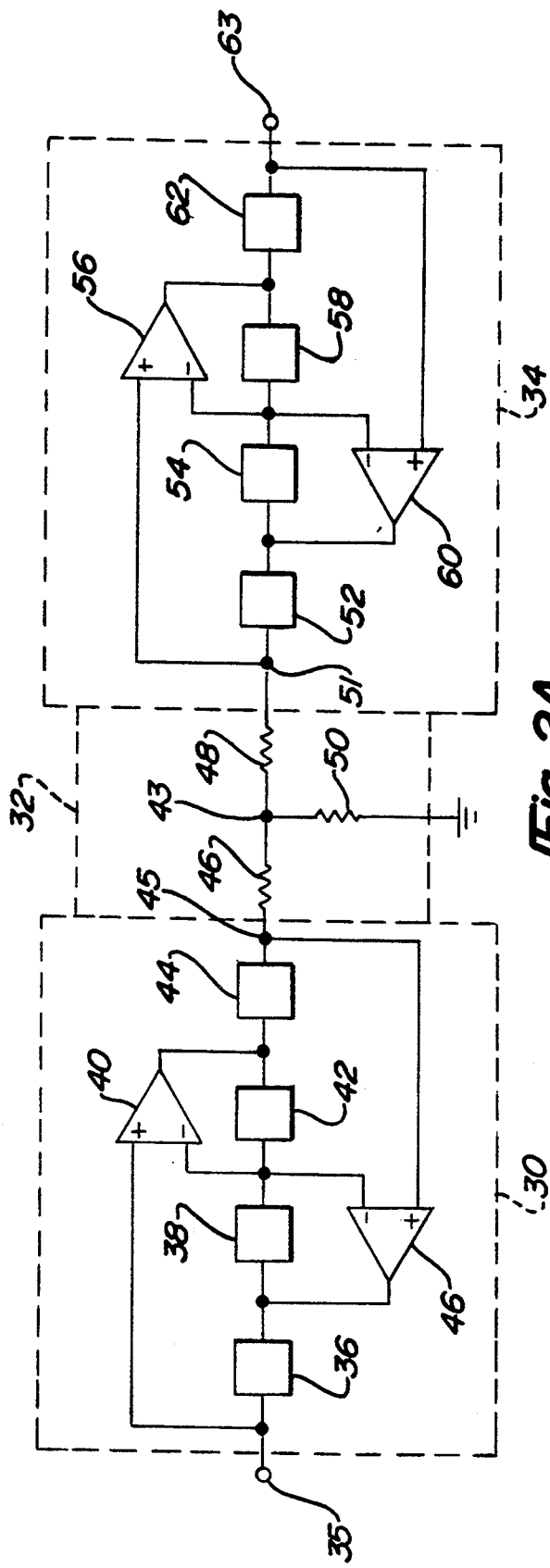
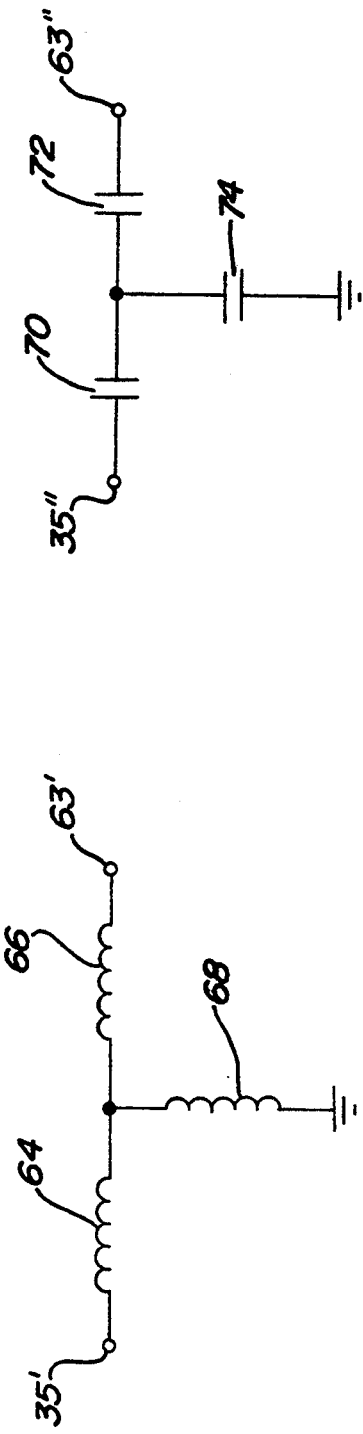

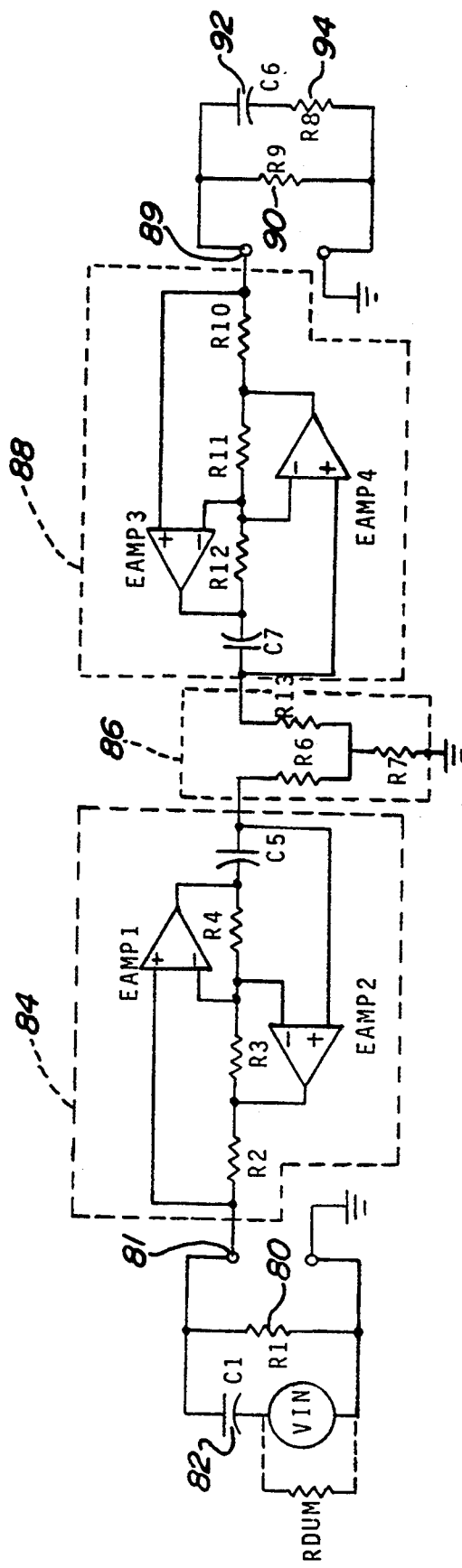
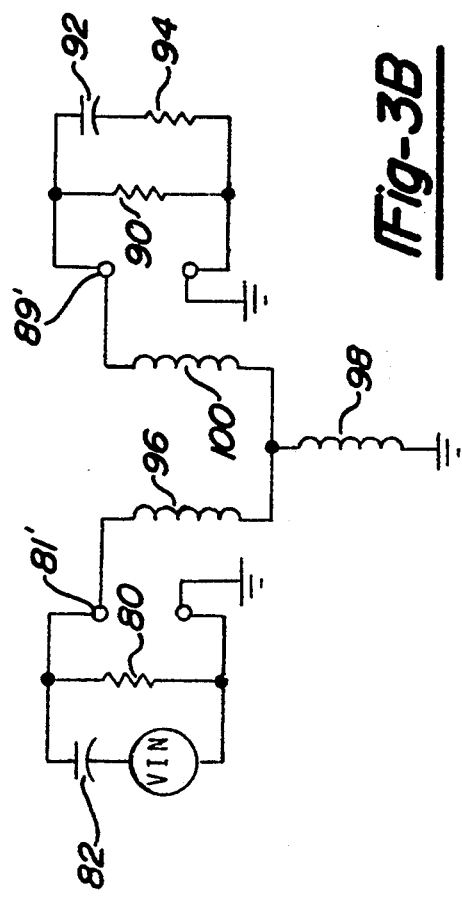
Fig-3A
Fig-3B

SIMULATED COUPLED INDUCTORS USING GENERALIZED IMPEDANCE CONVERTERS

BACKGROUND OF THE INVENTION

1. Technical Field

This invention relates to electronic devices used to shape amplitude with respect to frequency, and more particularly, to bandpass filters using Generalized Impedance Converters (GIC).

2. Discussion

Linear circuit functions such as bandpass filters are used to control or shape the time or frequency domain of high frequency signals. At first, passive elements, namely resistors (R), inductors (L) and capacitors (C) were used. It was later found that if active elements such as operational amplifiers are used, then the reactive elements (capacitors and inductors) may be removed without loss of circuit performance. A likely element to replace was the inductor because of its size, power distribution, non-linearity and weight. While capacitors may be directly included in integrated circuit realizations using silicon layering techniques, inductors generally must be realized by discrete elements that must be externally "wired" into the integrated circuit.

Generalized Impedance Converters were developed to overcome some of these problems. These circuits simulate the frequency response characteristics of inductors by using a combination of operational amplifiers, capacitors and resistors. It should be noted that by using impedance scaling, a Generalized Impedance Converter can also simulate a capacitor. Even though capacitors are used in the design of the Generalized Impedance Converter, a trade-off for more efficient capacitor values can be made. The uses of Generalized Impedance Converters were limited though because the operational amplifiers are active devices and, consequently, one terminal must typically be grounded. Thus the RLC network must also be of the type with all simulated inductors and simulated capacitors grounded which limits the application to highpass filter circuits.

Critically coupled transformers use coupled capacitors or coupled inductors to magnetically couple the input to the output. Magnetically coupled circuits pass signal voltage to the output at frequencies near resonance and block other frequencies. The circuit model used to describe coupled inductors uses three inductors in a "T" shaped configuration with two of the inductors floating and one grounded. An analogous model exists for capacitors. If the impedance on both sides of the coupled transformer is matched, the output will have symmetric upper and lower stopband attenuation. The pass band width at resonance depends on the degree of coupling between the circuits. Again, the problem with using inductors in this circuit design is that it is not easy to implement in integrated circuit form, and it has high power dissipation.

Current technology is lacking a simple realization of an active bandpass filter with symmetric upper and lower stopband attenuation, a variable pass band width, and variable attenuation. It can be appreciated that there is a need for simulated coupled inductors in critically coupled transformers for electronic filtering circuits, especially in those realized in integrated circuit form.

SUMMARY OF THE INVENTION

In accordance with the teachings of the present invention, an electronic device for shaping frequency responses includes first and second Generalized Impedance Converters, each including a combination of resistors, capacitors and operational amplifiers. A coupler network including a plurality of resistors is coupled between the first and second Generalized Impedance Converters. One node of the coupler is connected to the output of the first Generalized Impedance Converter and a second node of the coupler is connected to the output of the second Generalized Impedance Converter. A third node of the coupler is connected to ground. The resistors of the coupler means define the degree of coupling between the first Generalized Impedance Converter and the second Generalized Impedance Converter.

BRIEF DESCRIPTION OF THE DRAWINGS

The various advantages of the present invention will become apparent to one skilled in the art upon reading the following specification and by reference to the drawings in which:

FIG. 1 is a block diagram which schematically illustrates a typical example of the use of the invention in a frequency shaping circuit;

FIG. 2(A) shows the resistive coupler and the Generalized Impedance Converters before impedance scaling;

FIG. 2(B) shows the equivalent circuit of FIG. 2(A) after the Generalized Impedance Converters are impedance scaled to be inductors;

FIG. 2(C) shows the equivalent circuit of FIG. 2(A) after the Generalized Impedance Converters are impedance scaled to be capacitors;

FIG. 3(A) shows the realization of simulated coupled inductors used in a bandpass filter;

FIG. 3(B) shows the equivalent circuit of FIG. 3(A);

DESCRIPTION OF THE PREFERRED EMBODIMENTS

Figure 4:
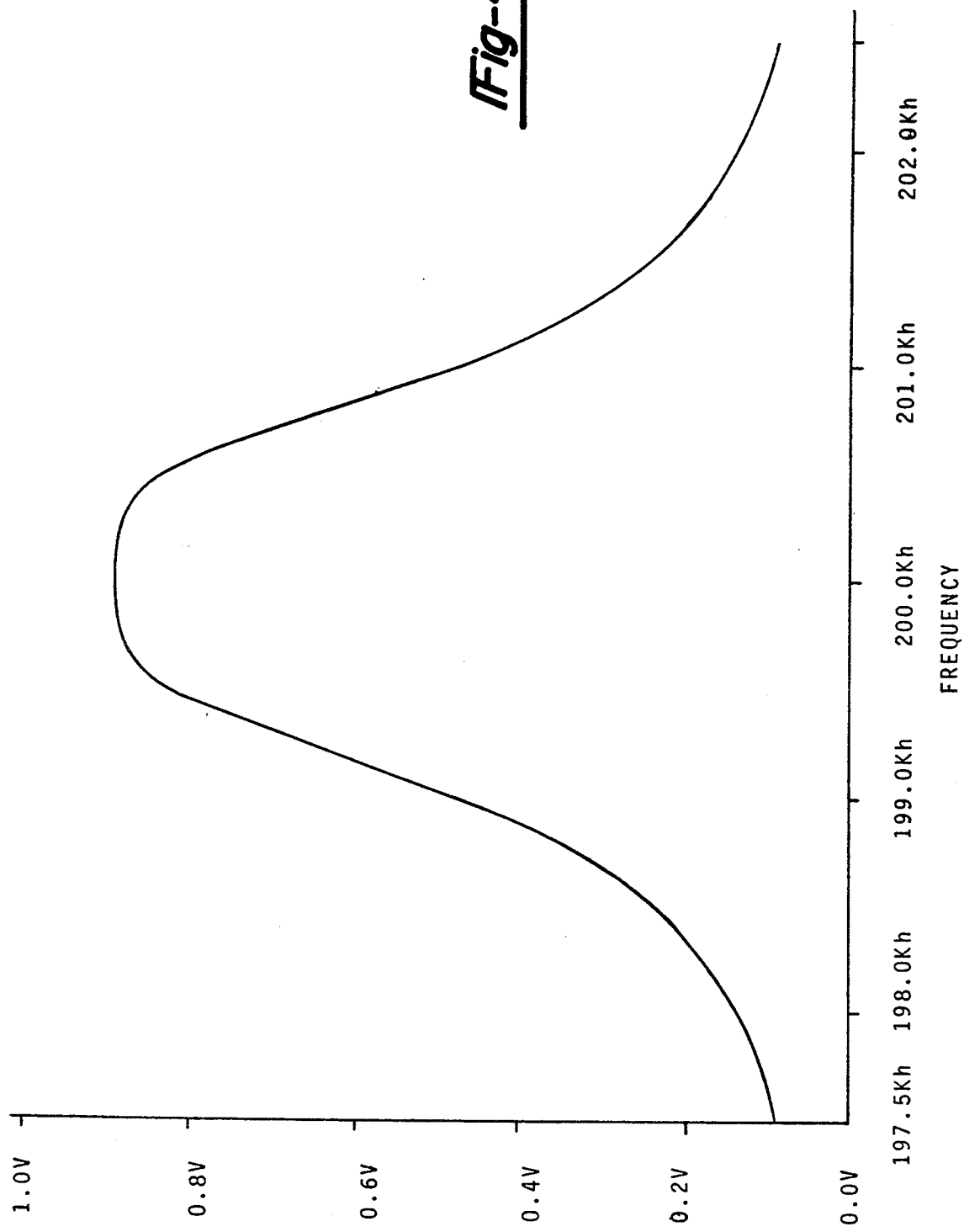
FIG. 4 is a waveform diagram showing the output amplitude versus frequency for the filter of FIG. 3(A).

In FIG. 1 there is shown a general frequency shaping electronic circuit. The circuit has a first Generalized Impedance Converter 14, a second Generalized Impedance Converter 18 and a resistive "T" coupling 16. These three elements work together to simulate coupled reactive elements. Additionally, this circuit contains resistive and capacitive (R-C) devices 12 and 20, that help to further shape the frequency response of the input 10, such that the desired output 22 is obtained. It is known in the art that a Generalized Impedance Converter can simulate the frequency response characteristics of inductors and capacitors by using operational amplifiers, capacitors and resistors. The resistive "T" coupling 16 uses a novel placement of resistors to allow an interaction between the first Generalized Converter 14 and the second Generalized Impedance Converter 18. It should be noted from the outset that the present invention has applicability with a wide variety of electronic circuits, and therefore this example should not be considered as limiting.

By choosing the attenuation at a given distance from resonance, the appropriate value of coupling k (or Q=1/k) can be determined from critically coupled transformer data. The three elements work together to simulate a reactive component are further broken down in FIG. 2(A). The first Generalized Impedance Converter 30 is made up of four impedances 36, 38, 42 and 44 and two operational amplifiers, 40 and 46. The second Generalized Impedance Converter 34 is made up of four impedances 52, 54, 58 and 62 and two operational amplifiers 56 and 60. The resistive "T" coupler section 32 is realized in this invention by three resistors 46, 48 and 50. Resistor 46 is connected between a common node 43 and the first Generalized Impedance Converter output 45. Resistor 48 is connected between the output 51 of the second Generalized Impedance Converter 34 and the common node 43, while resistor 50 is connected between common node 43 and ground. It should be noted that Generalized Impedance Converters 30 and 34 are mirror images and thus their outputs 45 and 51 are connected to the coupler section 32. However, when used as a bandpass filter, the input of the second Generalized Impedance Converter 34 is used as the output 89 of the filter as shown in FIG. 3(A).

Both the first Generalized Impedance Converter 30 and the second Generalized Impedance Converter 34 can simulate the frequency response of an inductor. In FIG. 2(B) there is shown two floating inductors 64 and 66, and a grounded inductor 68. This inductive "T" section is the model used in the art to mathematically describe coupled inductors with the grounded inductor 68 giving the value of the mutual inductance. To have the first Generalized Impedance Converter 30 and the second Generalized Impedance Converter 34 simulate inductors the impedances 36, 62, 38, 58, 42 and 54 should be resistors and the impedances 44 and 52 should be capacitors. The inductance of the first Generalized Impedance Converter 30 is defined by the product of the resistor 36, resistor 42, capacitor 44 and the sum of resistor 46 and resistor 50 divided by resistor 38. This relationship is accurate when resistor 46 equals resistor 48 and resistor 50 is an order of magnitude less than resistor 48. An analogous definition defines the inductance for the second Generalized Impedance Converter 34. For resonance, the inductance of the first Generalized Impedance Converter 30 must be equal to the inductance of the second Generalized Impedance Converter 34. The degree of coupling or mutual inductance is defined by the ratio of resistor 50 divided by the sum of the resistor 46 and the resistor 50. Since these resistor values are not given, they must be determined by setting the degree of coupling using known tables on critically coupled transformers and choosing one of the resistor values.

With the first Generalized Impedance Converter 30, the second Generalized Impedance Converter 34 and the resistive coupling 32 connected as previously described, FIG. 2(A) can be replaced by FIG. 2(B) with node 35 identical to 35' and 63 identical to 63'. The value of the first floating inductor 64 is defined as the inductance of the first Generalized Impedance Converter 30 minus the mutual inductance 68. The second floating inductance 66 is equal in value to the second Generalized Impedance Converter 34 minus the mutual inductance 68.

FIG. 3(A) shows the first Generalized Impedance Converter 84 and the second Generalized Impedance Converter 88, both impedance scaled to be inductors and the resistive "T" coupling 86 in a bandpass application. In FIG. 1 there is shown additional resistive and capacitive devices 12 and 20, which are also shown in FIG. 3(A) at 80, 82 and 90, 92, 94. One of the resistive devices 80 has a value determined by the product of 2 Pi, the resonant frequency, the first Generalized Impedance Converter inductance 84, and the critical coupling coefficient Q. A second resistor 90 is included in the circuit with a value equal to that of resistor 80. Capacitor 82 and capacitor 92 have values determined by the known resonant frequency equation for simple parallel RLC circuits. An additional resistor 94 is included in this design for the purposes of the simulation only, and its effect is negligible. FIG. 3(B) shows FIG. 3(A) with the simulated coupled inductors drawn in. Again, the model consists of three inductances, one grounded inductor 98, and two floating inductors, 96 and 100.

TABLE I

```
VIN 1 0 AC .01
C1 1 2 633.2574PF
RDUM 1 0 10MEG
R1 2 0 224.22929K.
R2 2 3 2K.
R3 3 4 2K.
R4 4 5 2K.
C5 5 6 .25NF
R6 6 7 1.98879K.
EAMP1 5 0 2 4 200K.
EAMP2 3 0 6 4 200K.
.PROBE
.AC LIN 400 190K. 210K.
R7 7 0 11.2085
R8 11 0 .000001
C6 11 12 633.2574PF
R9 12 0 224.22929K.
R10 12 13 2K.
R11 13 14 2K.
R12 14 15 2K.
C7 15 16 .25NF
R13 16 7 1.98879K.
EAMP3 15 0 12 14 200K.
EAMP4 13 0 16 14 200K.
.END
```

Table I shows the Spice input file for the circuit shown in FIG. 3(A), with node definitions that are obvious to those skilled in the art. The output of the circuit shown in FIG. 3(A) and FIG. 3(B) in response to a one volt input across the frequency domain is shown in FIG. 4. In this case, a critically coupled transformer with 20 decibels of attenuation for ±2.5 kHz and a resonant frequency of 200 kHz is chosen. Note that at 197.5 kHz the output is 0.1 volts, and at 202.5 kHz the output is 0.1 volts. The plotted response is typical of a critically coupled transformer. Note that 20 decibels attenuation for a 1 volt input is 0.1 volts, thus verifying the design. This invention greatly simplifies the realization of active bandpass filters by implementing integral resonator coupling via simulated coupled inductors.

The Generalized Impedance Converter 30 and a second Generalized Impedance Converter 34 can also be impedance scaled to simulate a capacitor instead of an inductor as previously described. A trade-off for more efficient capacitor values with respect to size and power dissipation can be made. In this alternate example, the impedances in 38, 42, 44, 54, 58 and 62 in FIG. 2(A) would be resistors and the impedances 36 and 52 would be capacitors. The coupled "T" section resistors 32 would allow the first Generalized Impedance Converter 30 and the second Generalized Impedance Converter 34 to simulate coupled capacitors 70 and 72, respectively shown in FIG. 2(C), with the capacitor 74 being equal in value to the mutual capacitance. The analysis of the capacitive "T" section is analogous to the inductive "T" section previously described.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, specification and following claims.

What is claimed is:

1. An electronic device for shaping frequency response, comprising:

a) a first Generalized Impedance Converter including resistors, capacitors and operational amplifiers with an input and an output, said first Generalized Impedance Converter comprising at least four impedance elements and two operational amplifiers interconnected to simulate the frequency response of an inductor or a capacitor; and b) a second Generalized Impedance Converter including resistors, capacitors and operational amplifiers with an input and an output, said second Generalized Impendance Converter comprising at least four impedance elements and two operational amplifiers interconnected to simulate the frequency response of an inductor or a capacitor; and c) a coupler means including a plurality of resistors with one node of said coupler means connected to the output of said first Generalized Impedance Converter and with a second node of said coupler means connecting to the output of said second Generalized Impedance Converter and a third node of said coupler means connected to ground such that said resistors of said coupler means define the degree of coupling between said first Generalized Impedance Converter and said second Generalized Impedance Converter.

2. The electronic device of Claim 1, wherein the resistors, capacitors and operational amplifiers in said first Generalized Impedance Converter and in said second Generalized Impedance Converter are interconnected to each simulate the frequency response of an inductor, and wherein the values of said resistors of said coupler means define the degree of coupling between said first inductive Generalized Impedance Converter and said second inductive Generalized Impedance Converter.

3. The electronic device of Claim 1, wherein the resistors, capacitors and operational amplifiers in said first Generalized Impedance Converter and in said second Generalized Impedance Converter are interconnected to each simulate the frequency response of a capacitor, and wherein the values of said resistors of said coupler means define the degree of capacitive coupling between said first Generalized Impedance Converter and said second Generalized Impedance Converter.

4. The electronic device of claim 2 or 3, wherein the coupler means includes first, second and third resistor means each having two ends, one end of each of the resistive means being coupled to a common node, the opposite end of the first resistive means being connected to ground, the opposite end of the second resistive means being coupled to the output of the first Generalized Impedance Converter, and the opposite end of the third resistive means being connected to the output of the second Generalized Impedance Converter.

5. The coupler means of claim 4, wherein said degree of said coupling is defined as the ratio of said first resistive means divided by the sum of said second resistive means and said first resistive means and wherein said second resistive means is equal in resistance to said third resistive means and wherein said first resistive means is an order of magnitude less than said second resistive means and said third resistive means.

6. A bandpass filter circuit, comprising:

a) a first Generalized Impedance Converter with an input terminal and output terminal including first, second and third resistive means with two ends each, a first and second operational amplifier with a positive input, a negative input and an output; and a first capacitive means with two ends, wherein one end of said first resistive means is connected to said input terminal of said first Generalized Impedance Converter and to said positive input of said first operational amplifier and the other end of said first resistive means is connected to said output of said second operational amplifier and to one end of said second resistive means, wherein the other end of said second resistive means is connected to said negative input of said first operational amplifier and connected to said negative input of said second operational amplifier and connected to an end of said third resistive means, wherein the other end of said third resistive means is connected to an end of said first capacitive means and to said output of said first operational amplifier, and wherein the other end of said first capacitor means is connected to said positive input of said second operational amplifier and to said output terminal of said first Generalized Impedance Converter;

b) a second Generalized Impedance Converter with an input terminal and output terminal including fourth, fifth and sixth resistive means with two ends each, a third and fourth operational amplifier with a positive input, a negative input and an output, and a second capacitive mans with two ends wherein one of said fourth resistive means is connected to said input terminal of said second Generalized Impedance Converter and to said positive input of said third operational amplifier, wherein the other end of said fourth resistive means is connected to said output of said fourth operational amplifier and to one end of said fifth resistive means, wherein the other end of said fifth resistive means is connected to said negative input of said third operational amplifier and to said negative input of said fourth operational amplifier and to one end of said sixth resistive means, wherein the other end of said sixth resistive means is connected to one end of said second capacitive means and to said output of said third operational amplifier, and wherein the other end of said second capacitor means is connected to said positive input of said fourth operational amplifier and to said output terminal of said second Generalized Impedance Converter;

c) a coupler means including a seventh, eighth and ninth resistive means with two ends each, wherein said eighth resistive means is connected at one end to an end of said seventh resistive means and to an end of said ninth resistive means, wherein the other end of said eighth resistive means is connected to ground, wherein the end of said seventh resistive means is connected to said output of said first Generalized Impedance Converter, wherein the other end of said ninth resistive means is connected to said output of said second Generalized Impedance Converter, wherein degree of said inductive coupling is defined as the ratio of said eighth resistive means divided by the sum of said seventh resistive means and said eighth resistive means, wherein said seventh resistive means is equal in resistance to said ninth resistive means and wherein said eighth resistive means is at least an order of magnitude less than seventh resistive means and said ninth resistive means;

d) a tenth resistive means with two ends and a third capacitive means with two ends, wherein an end of said tenth resistive means is connected to said input terminal of said first Generalized Impedance Converter an connected to an end of said third capacitive means, wherein the other end of said tenth resistive means is connected to ground, and wherein the other end of said third capacitive means is connected to an input signal;

e) an eleventh and twelfth resistive means with two ends each, and a fourth capacitive means with two ends, wherein an end of said eleventh capacitive means is connected to the input of said second Generalized Impedance Converter and to an end of said fourth capacitive means, wherein the other end of said eleventh resistive means is connected to ground, wherein the other end of said fourth capacitive means is connected to an end of said twelfth resistive means, wherein the other end of said twelfth resistive means is connected to ground, and wherein an output signal is taken from said input of said second Generalized Impedance Converter.

* * * * *